(12) United States Patent
Ikeda

(10) Patent No.: US 7,855,589 B2
(45) Date of Patent: Dec. 21, 2010

(54) PULSE GENERATOR CIRCUIT AND COMMUNICATION APPARATUS

(75) Inventor: Masayuki Ikeda, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 65 days.

(21) Appl. No.: 12/394,653

(22) Filed: Feb. 27, 2009

(65) Prior Publication Data

US 2009/0219061 A1  Sep. 3, 2009

(30) Foreign Application Priority Data

Mar. 3, 2008 (JP) ............................. 2008-051704
Jan. 5, 2009 (JP) ............................. 2009-000063

(51) Int. Cl.
 *G06F 1/04* (2006.01)
(52) U.S. Cl. ...................................... 327/291
(58) Field of Classification Search ................. 327/291, 327/299
See application file for complete search history.

(56) References Cited

U.S. PATENT DOCUMENTS

| 6,421,389 | B1 | 7/2002 | Jett et al. |
| 7,449,932 | B2 * | 11/2008 | Ikeda .......................... 327/291 |
| 7,719,338 | B2 * | 5/2010 | Ikeda .......................... 327/291 |
| 2001/0033576 | A1 | 10/2001 | Richards |
| 2003/0108133 | A1 | 6/2003 | Richards |

FOREIGN PATENT DOCUMENTS

| JP | A-2006-229677 | 8/2006 |
| JP | A-2006-311509 | 11/2006 |
| JP | A-2007-228546 | 9/2007 |
| JP | A-2007-274680 | 10/2007 |
| JP | A-2007-274681 | 10/2007 |

OTHER PUBLICATIONS

Terada et al., "A CMOS Impulse Radio Ultra-Wideband Transceiver for 1Mb/s Data Communications and ±2.5cm Range Findings," *2005 Symposium on VLSI Circuits Digest of Technical Papers*, Jun. 16-18, 2005, pp. 30-33.
Barajas et al., "A Low-Power Template Generator for Coherent Impulse-Radio Ultra Wide-Band Receivers," *Proceedings IEEE ICUWB*, 2006, pp. 1-5.

* cited by examiner

*Primary Examiner*—Hai L Nguyen
(74) *Attorney, Agent, or Firm*—Oliff & Berridge PLC

(57) ABSTRACT

A pulse generator circuit that outputs pulses having a predetermined shape from an output terminal based on a start signal includes a timing generator circuit that generates (n+1) signals (n is an integer greater than or equal to 2), the phases of which sequentially change at predetermined time intervals from the point when the phase of the start signal changes, first and second power supplies that supply predetermined potentials, n impedance devices, and a switching circuit that connects the output terminal to the first or second power supply in a predetermined order according to the value of a logic function based on the (n+1) signals via the corresponding impedance device.

4 Claims, 12 Drawing Sheets

|  | G1a | G1b | G1c | G2a | G2b | G2c | G3a | G3b | G3c | G4a | G4b | G4c |
|---|---|---|---|---|---|---|---|---|---|---|---|---|
| SWITCHING CIRCUIT 301 | D9 | D2 | XD3 | XD3 | D4 | XD5 | XD5 | D6 | XD7 | XD7 | D8 | XD9 |
| SWITCHING CIRCUIT 302 | XD10 | XD3 | D4 | D4 | XD5 | D6 | D6 | XD7 | D8 | D8 | XD9 | D10 |
| SWITCHING CIRCUIT 303 | XD9 | XD2 | D3 | D3 | XD4 | D5 | D5 | XD6 | D7 | D7 | XD8 | D9 |
| SWITCHING CIRCUIT 304 | D10 | D3 | XD4 | XD4 | D5 | XD6 | XD6 | D7 | XD8 | XD8 | D9 | XD10 |

US 7,855,589 B2

PULSE GENERATOR CIRCUIT AND COMMUNICATION APPARATUS

BACKGROUND

1. Technical Field

The present invention relates to a pulse generator circuit that generates pulses suitable for UWB (Ultra Wide Band) communication, and also relates to a communication apparatus.

2. Related Art

UWB communication is a high-speed, large-capacity data communication method using an ultra-wide frequency band. Other examples of the communication method using a wideband signal include conventional spectrum spreading and orthogonal frequency division multiplexing (OFDM). On the other hand, UWB is a wider band communication method using ultra-short pulses, and also called an impulse radio (IR) communication, which is hereinafter referred to as a UWB-IR method or simply referred to as an IR method. In the IR method, only time-base operation, which is not based on conventional modulation, allows modulation and demodulation, and it is expected that the circuitry is simplified and the power consumption is reduced (see U.S. Pat. No. 6,421,389, United States Patent Application Publication No. 2003/0,108,133 A1, and United States Patent Application Publication No. 2001/0,033,576).

The pulse waveform used in the IR method will be briefly described below with reference to the drawings. A pulse train having a pulse width $P_D$ and a cycle $T_P$ shown in FIG. 10A is well known, and the frequency spectrum of the pulse train is a sinc function the envelope of which has a first zero point at a frequency $BW=1/P_D$, as shown in FIG. 10B.

The pulses shown in FIG. 10B are not easy to use because the spectrum spans DC to BW, whereas pulses shown in FIG. 10D, in which the carrier frequency $f_0$ at the center of the spectrum is on the high frequency side, are preferable. The pulse waveform is obtained by clipping the portions of a rectangular wave having a frequency $f_0=1/(2P_W)$ that correspond to the pulses in FIG. 10A and moving them toward the high frequency side of the frequency spectrum. The waveform, however, contains a DC component indicated by the dashed line 1601 in FIG. 10C, and does not have the ideal spectrum shown in FIG. 10D in the exact sense.

A waveform having the ideal spectrum is shown in FIG. 10E. The waveform is obtained by multiplying the pulses shown in FIG. 10A by a sinusoidal wave having the carrier frequency $f_0$. FIG. 10F shows a waveform obtained by multiplying the pulses shown in FIG. 10A by a rectangular wave having the carrier frequency $f_0$, and the waveform is readily generated by a digital circuit. Since an actual digital circuit has a narrow pulse width, such a square-cornered waveform will not be generated, but the waveform shown in FIG. 10E will be obtained. When the waveform shown in FIG. 10C is used to drive an antenna, the DC component will not be radiated from the antenna, and a signal the waveform of which is close to the waveform shown in FIG. 10F will be radiated.

Other pulse waveforms ideal for the UWB communication have been invented, and Gaussian pulses and Hermitian pulses are believed to be suitable. Although different from the waveforms shown in FIGS. 10A to 10G, these pulses are frequently used because they are readily generated.

In the UWB communication, the thus generated pulses are used not only in a transmitter, but also in a receiver as template pulses for evaluating correlation with a received signal. In the receiver, differential signal processing is often carried out, and two signals having phases inverted from each other shown in FIG. 10G are often required. The differential pulse signals are also effective in the transmitter, for example, when a balanced antenna is driven. In the receiver circuit, what is called IQ signals, in which the phase of the in-phase signal differs from the phase of the quadrature signal by 90 degrees, is further required in many cases.

For example, "A Low-Power Template Generator for Coherent Impulse-Radio Ultra Wide-Band Receivers," Jose Luis et al, Proceedings IEEE ICUWB, 2006, pp. 97-102 presents a circuit for generating balanced pulses. The circuit, which has several differential delay circuits connected in tandem, generates a pulse train having a pulse width that corresponds to the amount of delay generated in a single delay circuit based on a logic circuit. "A Low-Power Template Generator for Coherent Impulse-Radio Ultra Wide-Band Receivers," Jose Luis et al, Proceedings IEEE ICUWB, 2006, pp. 97-102 suggests the possibility of reduction in power consumption by carrying out a pulse startup operation both in rise and fall periods of a signal inputted to the delay circuits, as well as the possibility of IQ signal generation by using every other delay circuit.

The pulse generator circuit of the related art described above having a simple circuit configuration can accurately generate ultra-high-frequency, ultra-wideband pulses necessary for UWB communication, and the generated fine pulses are substantially circuit constituent device performance limited.

As described with reference to FIGS. 10A to 10G, however, the spectral characteristics of the pulses generated by the circuit of the related art follow a sinc function, and hence suffer from a significantly broad side lobe. To use the pulses generated by the circuit in communication applications, the pulses need to be band-limited in some way. In the related art, a filter is used to band-limit the pulses. A problem with the filter is that the filter should be a bandpass filter that works at an ultra-wideband, ultra-high frequency that is close to the device performance limit and has good skirt characteristics and such a configuration is not easy to achieve.

SUMMARY

An advantage of some aspects of the invention is to solve at least part of the problems described above, and the invention can be embodied in the following forms or applications.

First Application

A first application of the invention provides a pulse generator circuit that outputs pulses having a predetermined shape from an output terminal based on a start signal, the pulse generator circuit including a timing generator circuit that generates (n+1) signals (n is an integer greater than or equal to 2), the phases of which sequentially change at predetermined time intervals from the point when the phase of the start signal changes, first and second power supplies that supply predetermined potentials, n impedance devices, and a switching circuit that connects the output terminal to the first or second power supply in a predetermined order according to the value of a logic function based on the (n+1) signals via the corresponding impedance device.

According to the above configuration, the first or second power supply is connected to the output terminal via any of the n impedance devices, and adjusting the n impedance devices allows adjustment of the speed at which the output terminal is charged and discharged, whereby the wave heights of pulse fingers of the output pulses can be set. Thus setting the n impedance devices allows the side lobe of the spectrum to be reduced. The present configuration can be achieved using a simple circuit, and the generated pulses can be band-limited. The pulses can be band-limited without using a special filter for limiting the band of the pulses. The present configuration is therefore significantly useful in configuring a UWB communication apparatus.

Second Application

In the pulse generator circuit described above, the device values of the n impedance devices are determined based on sampled values of the envelope of the pulses to be outputted.

According to the above configuration, controlling the device values of the n impedance devices allows the envelope of the output pulses to be controlled, whereby the spread of the frequency spectrum can be restricted, that is, the band can be limited. The pulses can be band-limited without using a special filter for limiting the band of the pulses. The present configuration is therefore significantly useful in configuring a UWB communication apparatus.

Third Application

In the pulse generator circuit described above, the impedance devices and the switching circuit are comprised of switching devices, each of which having an impedance when the switching device conducts current in a predetermined manner.

According to the above configuration, any of the impedance devices can be replaced with the impedance when the corresponding switching device conducts current, whereby the number of devices can be reduced.

Fourth Application

In the pulse generator circuit described above, the timing generator circuit includes delay circuits connected in tandem, each of the delay circuits generating a predetermined amount of delay.

According to the above configuration, it is possible to supply a circuit that can be readily configured in a semiconductor integrated circuit.

Fifth Application

A fifth application of the invention provides a communication apparatus including the pulse generator circuit described above.

According to the above configuration, using the pulse generator circuit as a template generator circuit in a modulation circuit or a demodulation circuit allows a stable circuit system to be employed and a highly-reliable, highly-sensitive apparatus to be configured at a low cost. It is further possible to generate high-frequency, accurate pulses close to the performance limit of the devices. The present configuration is therefore quite useful. Further, the pulse generator circuit having the present configuration can be formed in a CMOS integrated circuit or any other suitable circuit, and can generate an accurate pulse waveform in a simple circuit even when the pulse waveform is formed of fine pulses on the order of the operating transition period of the devices. Moreover, configuring the pulse generator circuit by using a CMOS integrated circuit allows the pulse generator circuit to readily operate at the highest speed of the CMOS integrated circuit without increase in operating power. It is, in particular, possible to readily generate high-frequency, wideband pulses usable in UWB communication.

BRIEF DESCRIPTION OF THE DRAWINGS

The invention will now be described with reference to the accompanying drawings, wherein like numbers reference like elements.

DESCRIPTION OF EXEMPLARY EMBODIMENTS

Embodiments of a pulse generator circuit will be described below with reference to the drawings.

First Embodiment

Configuration of Pulses to be Generated

Figure 10:
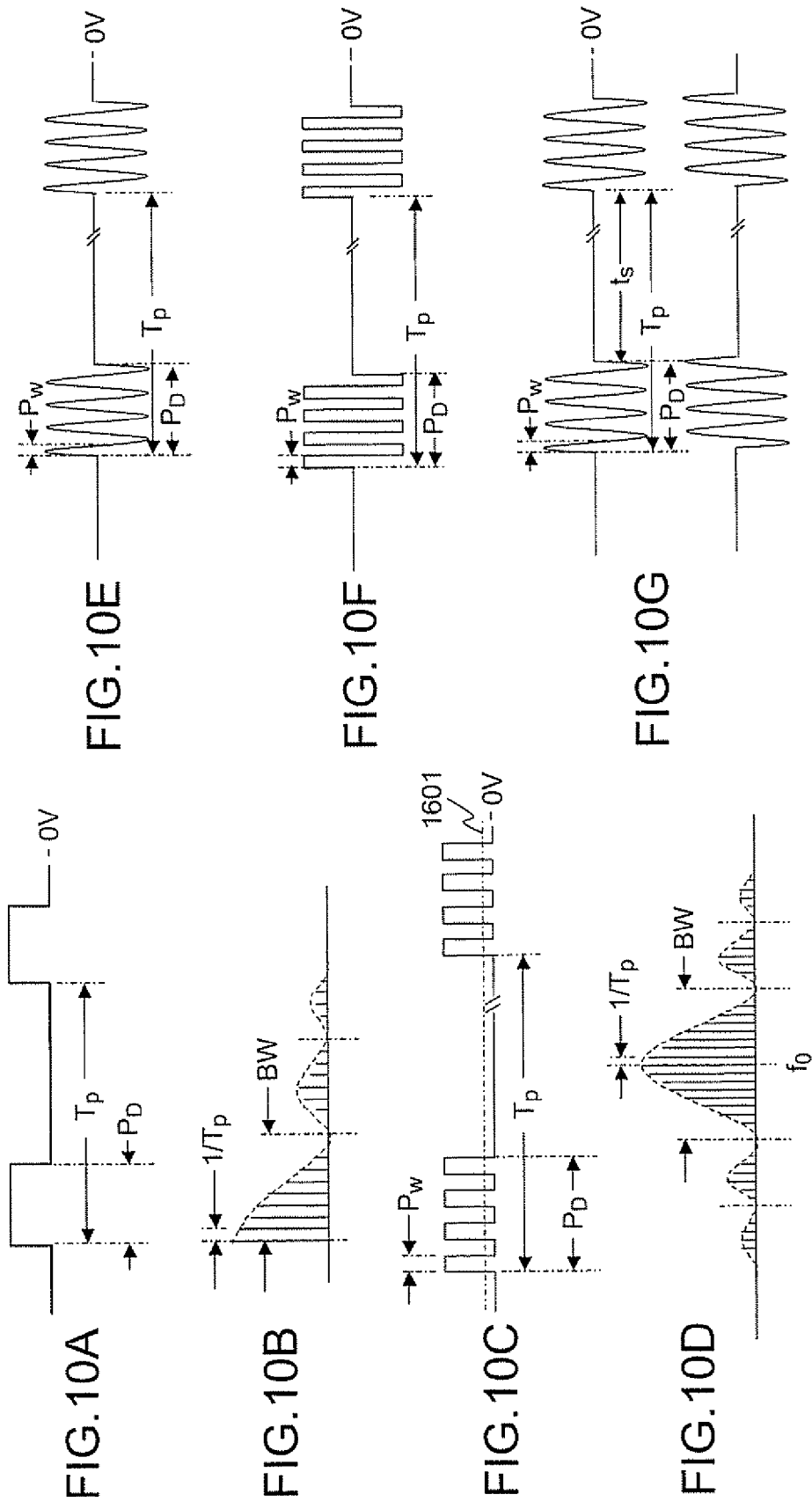
FIGS. 10A to 10G explain pulses generated in the present embodiment.

Pulses to be generated in the present embodiment will first be described with reference to FIGS. 10A-10G to FIG. 16. The pulses to be generated are single-ended output pulses shown in FIGS. 10E and 10F, or a pair of band-limited pulses having phases different from each other by 180 degrees shown in FIG. 10G. The waveform of the band-limited pulses will be described later in more detail with reference to FIGS. 11 to 16. FIG. 10G shows differential output pulse signals, and the potential difference between the outputs is equal to the waveform shown in FIG. 10E. Looking at the output potential difference as the differential signals, one can set the DC level during the no-pulse period indicated by $t_s$ shown in FIG. 10G to an arbitrary value as long as it is fixed.

The present embodiment will be described with reference to, by way of example, generation of the waveform having the following specifications, which are readily achievable by using 18-μm-CMOS (Complementary Metal Oxide Semiconductor) processes, but the invention is not limited thereto.

Figure 11:
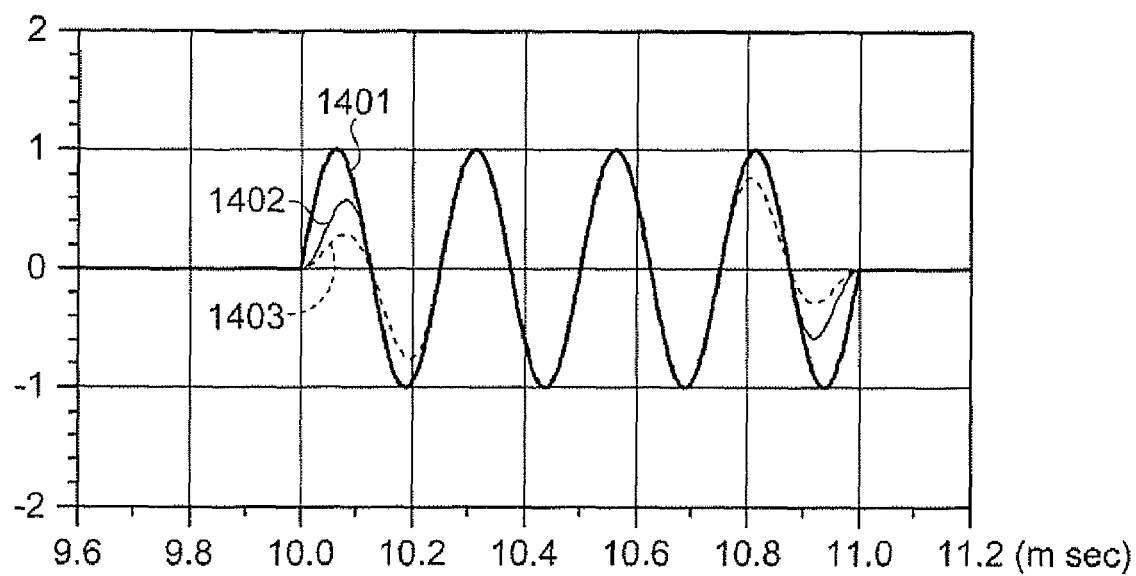
FIG. 11 shows graphs illustrating the waveforms of pulses generated in the present embodiment.

Pulse interval: $T_p$=arbitrary value
Carrier frequency: $f_0$=4 GHz
Carrier pulse width: $P_W$=125 psec
Pulse width: $P_D$=arbitrary value
The number of pulses contained in the period $P_D$ (the number of fingers): arbitrary value ($P_D$=(the number of fingers× 2−1)×$P_W$)
Signal form: single-ended output, differential output, and a pair of differential output IQ signals FIGS. 11 to 16 are graphs showing the waveforms obtained by band-limiting the waveforms shown in FIGS. 10E and 10G. The waveform 1401 in FIG. 11 is an example of the waveform in FIGS. 10E and 10G, which is not band-limited. To band-limit the waveform, the wave heights of the first and last pulses are lowered to round the pulse envelope. The waveform 1402 is obtained by setting the wave heights of the first and last pulse fingers to one-half the wave height of the original waveform. The waveform 1403 is obtained by setting the wave heights of the first and last fingers to one-third the wave height of the original waveform and setting the wave heights of the second and second last fingers to two-third the wave height of the original waveform.

Figure 12:
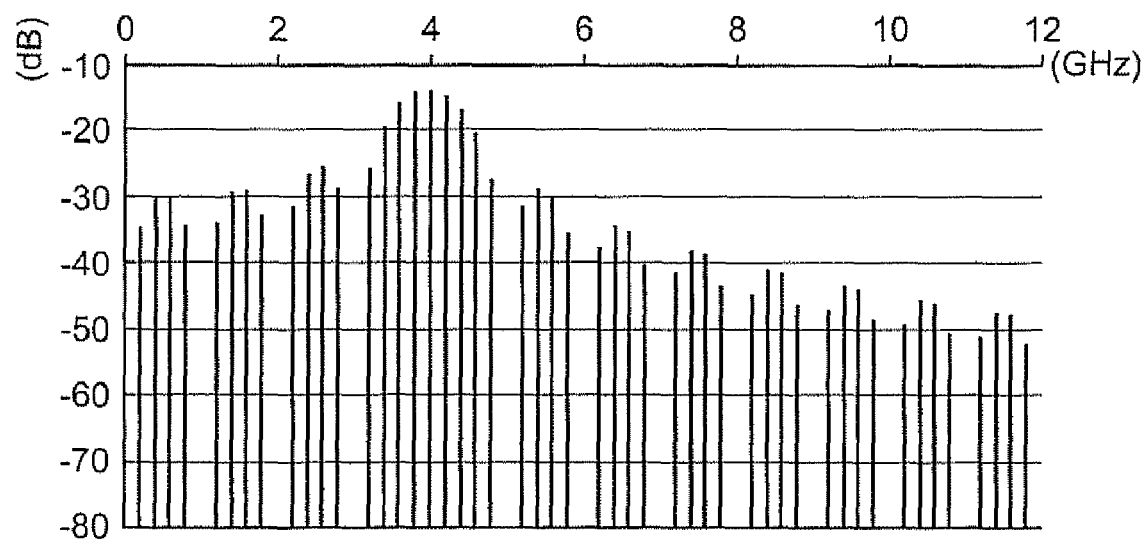
FIG. 12 is a graph showing the spectrum of the waveform of pulses generated in the present embodiment.
Figure 13:
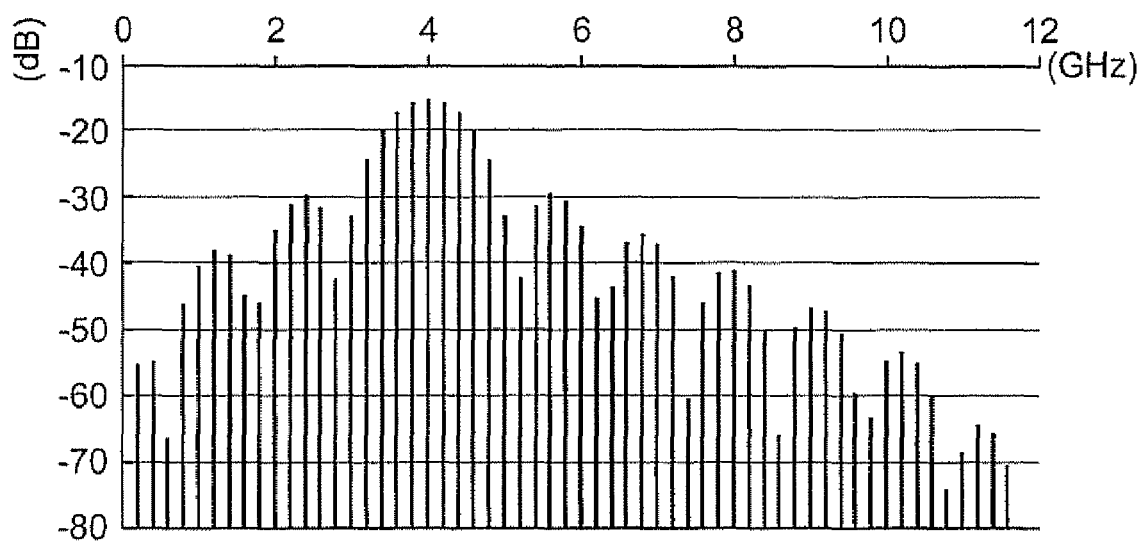
FIG. 13 is a graph showing the spectrum of the waveform of pulses generated in the present embodiment.
Figure 14:
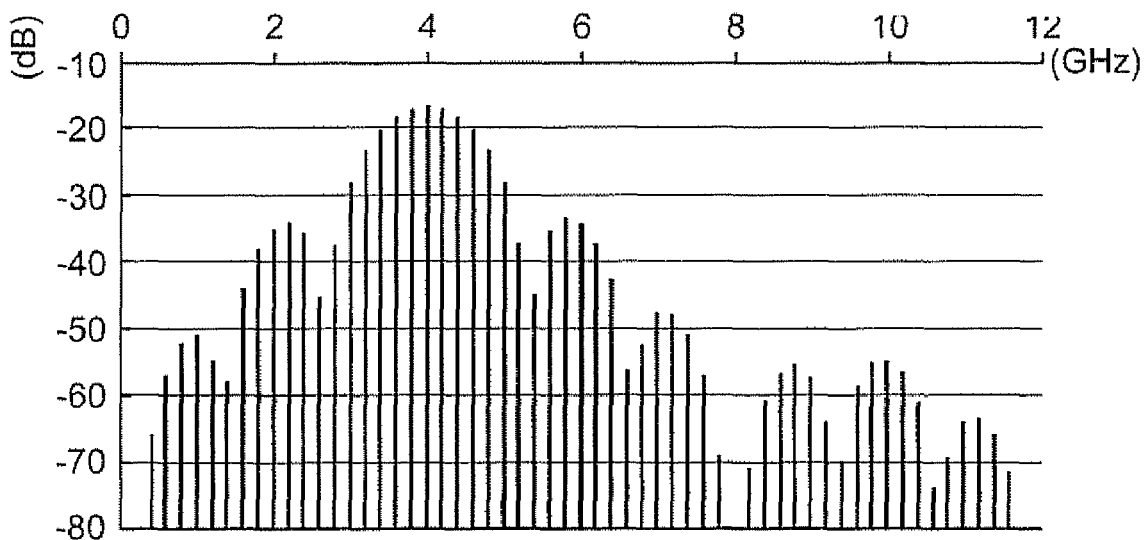
FIG. 14 is a graph showing the spectrum of the waveform of pulses generated in the present embodiment.

FIGS. 12 to 14 are graphs showing the spectra of the waveforms 1401 to 1403. FIG. 12 shows the spectrum of the waveform 1401 that has not been band-limited, and FIGS. 13 and 14 show the spectra of the waveforms 1402 and 1403 that have been band-limited. FIGS. 12 to 14 show respective single pulses shown in FIG. 11 repeated at a repetitive frequency of 200 MHz, which are line spectra at intervals of 200 MHz because no modulation is applied. Looking at how the spectra of the waveforms spread, one can see that the main lobes of the spectra of the waveforms 1402 and 1403 are slightly broader than that of the waveform 1401 that has not been band-limited, and the main lobe of the spectrum of the waveform 1403 is broader than that of the waveform 1402. The reason for this is that lowering the wave heights of the first and last pulses for band limitation equivalently shortens the pulse duration. Looking at the side lobes of the spectra, one can see that lowering the wave heights of the first and last pulses for band limitation is clearly effective. Although the difference at the first side lobe is only approximately several dB, the difference of several dB is valuable and very effective in configuring the system.

Figure 15:
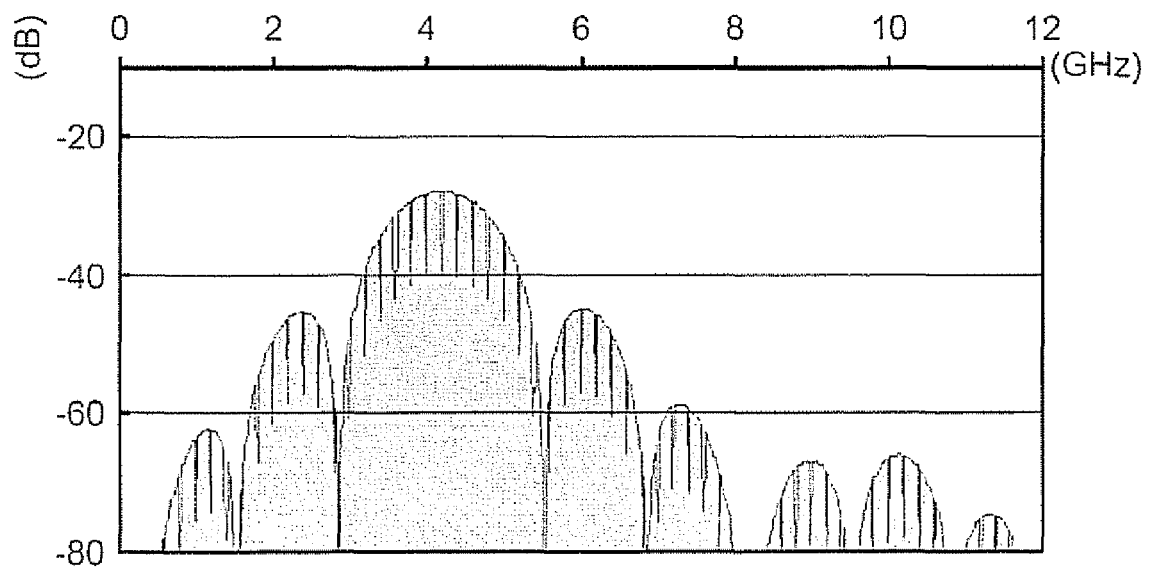
FIG. 15 is a graph showing the spectrum of the waveform of pulses generated in the present embodiment.
Figure 16:
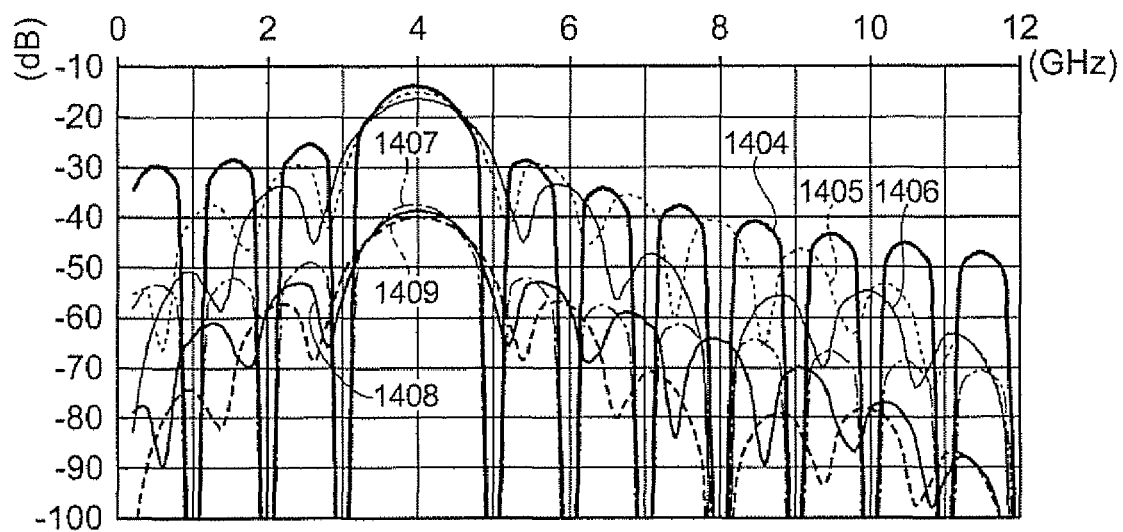
FIG. 16 shows graphs illustrating the spectra of the waveforms of pulses generated in the present embodiment.

FIGS. 12 to 14 show spectra when no modulation is applied. FIG. 15 is a graph showing the spectrum obtained by bi-phase modulating (BPM), by way of example, the waveform 1403 in accordance with a PN code having a length of 31. The modulation converts the line spectrum into a band spectrum and lowers the intensity of the spectrum. In practice, in the UWB communication, the acceptable upper limit of a spectrum is determined by legal regulations, and increase in spectrum intensity due to use of a line spectrum is not preferable. A measure is taken in actual use; for example, dithering is used to obtain a band spectrum. To understand band spectra obtained by dithering or any other suitable measure, FIG. 16 shows graphs illustrating the distributions of the spectra, by way of example, of the three waveforms described above, specifically, the spectra without modulation and the band spectra obtained by BPM using the PN code having a length of 31. FIG. 16 shows envelopes connecting only the peaks of the line spectra. In FIG. 16, the waveforms 1404, 1405, and 1406 are the envelopes of the spectra of the waveforms 1401, 1402, and 1403, respectively, shown in FIG. 11 when no modulation is applied thereto, and the waveforms 1407, 1408, and 1409 are band spectra of the waveforms 1401, 1402, and 1403, respectively, when modulation is applied thereto. It is found in each case that rounding the pulse envelope, that is, reducing the rate of envelope change at the first and last pulses, can reduce the side lobe of the spectrum.

Configuration of Pulse Generator Circuit

Figure 1:
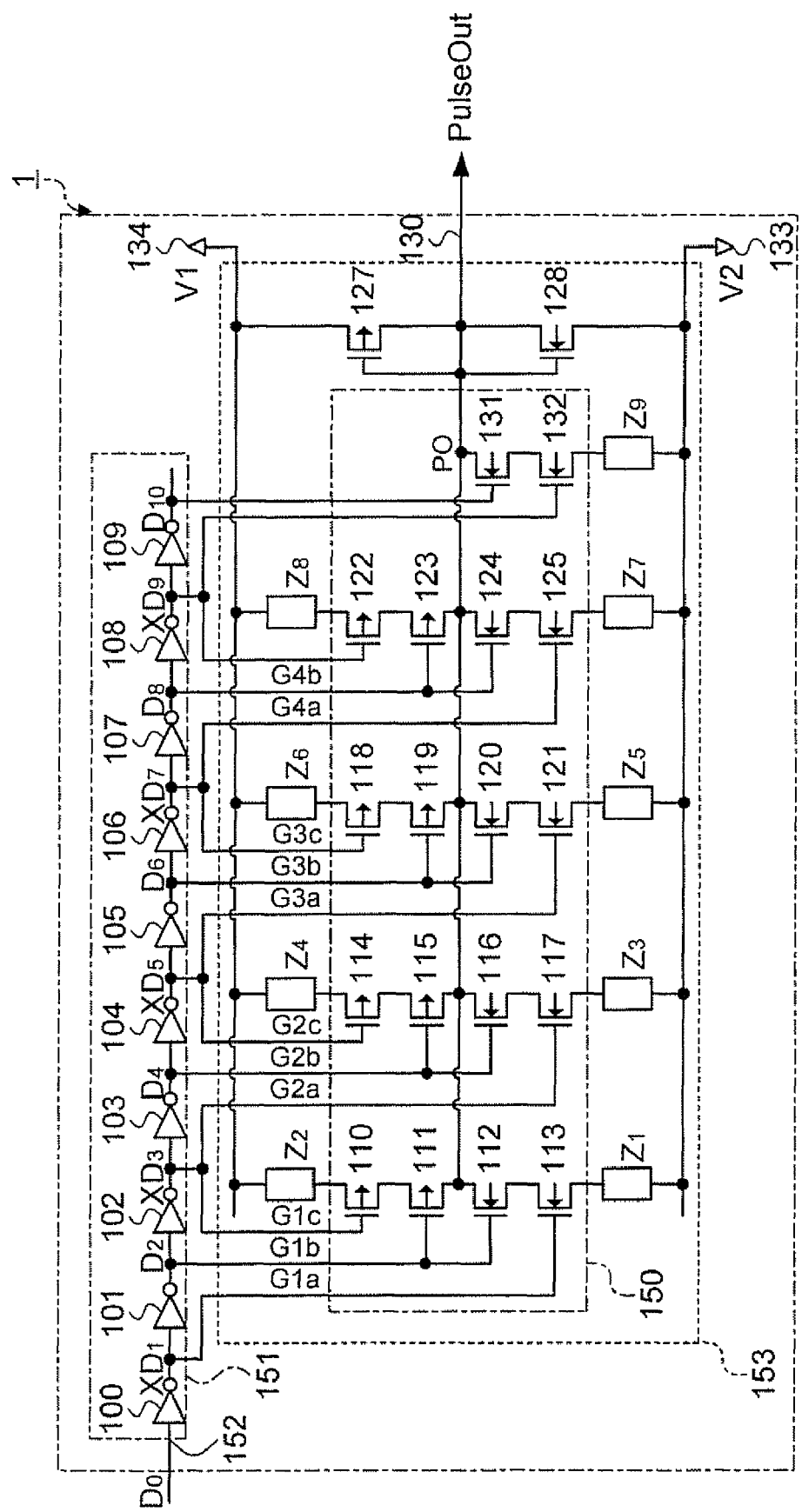
FIG. 1 is a circuit diagram showing the configuration of a pulse generator circuit according to a first embodiment.
Figure 2:
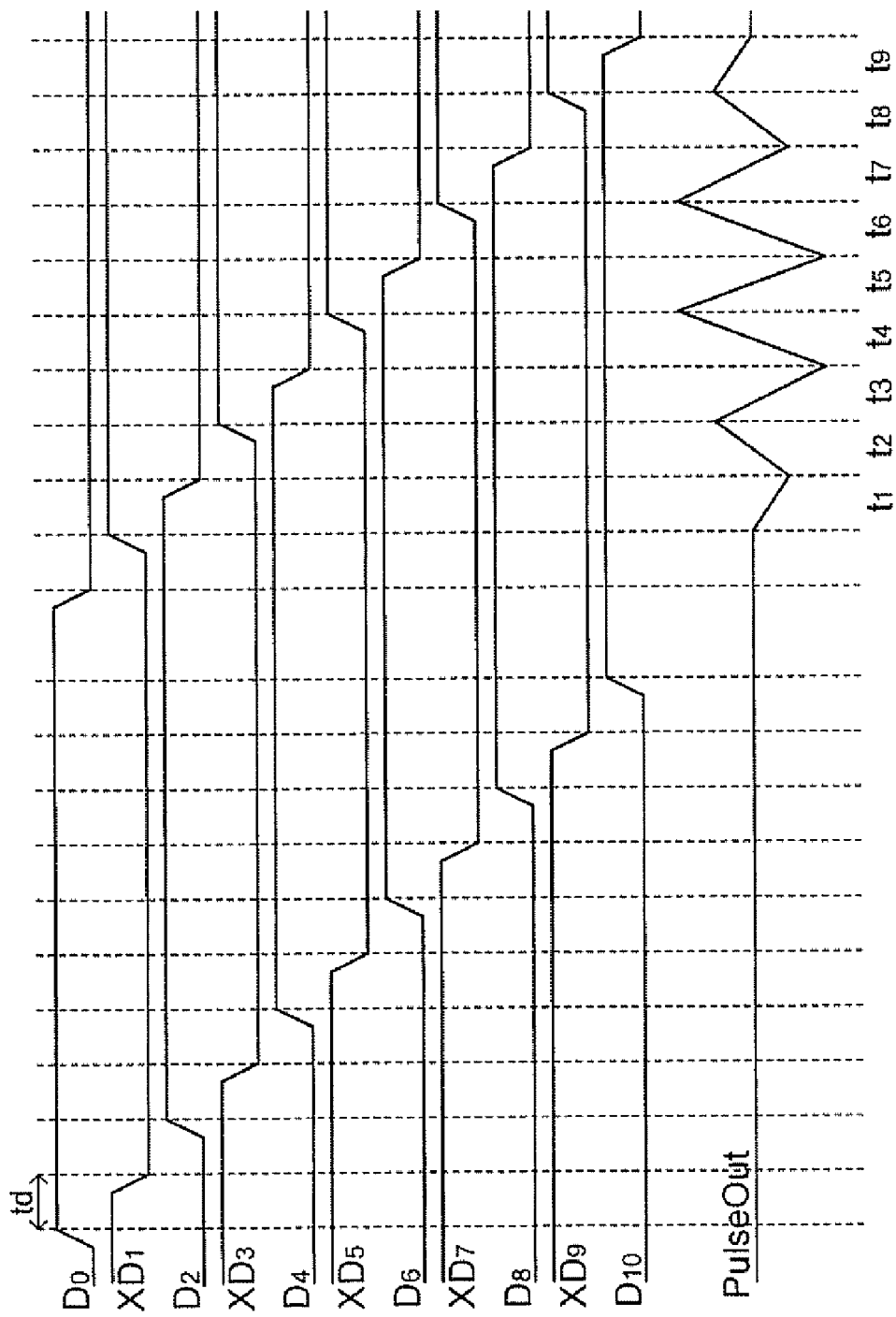
FIG. 2 is a timing chart showing the operation of the pulse generator circuit according to the first embodiment.

The pulse generator circuit will be described with reference to FIGS. 1 and 2. FIG. 1 is a circuit diagram showing the configuration of the pulse generator circuit. FIG. 2 is a timing chart showing the operation of the pulse generator circuit. As shown in FIG. 1, the pulse generator circuit 1 includes a timing generator circuit 151, a power supply line 134, which is a first power supply, a power supply line 133, which is a second power supply, 9 (=n) impedance devices $Z_1$ to $Z_9$, and a switching circuit 150.

The timing generator circuit 151 includes inverter delay circuits 100 to 109 connected in tandem. The amount of delay generated in each of the inverter delay circuits 100 to 109 is adjusted to be equal to the carrier pulse width $P_W$ (=125 ps). When the amount of delay is equal to the carrier pulse width $P_W$, the target pulses described above, that is, pulses having a carrier frequency $f_0$=4 GHz (carrier pulse width: $P_W$=125 ps), can be generated. Since each of the inverter delay circuits 100 to 109 inverts and delays a pulse start signal $D_0$, which is a start signal, 10 (=n+1) signals $XD_1$, $D_2$, $XD_3$, $D_4$, $XD_5$, $D_6$, $XD_7$, $D_8$, $XD_9$, and $D_{10}$ are generated, where the character X represents inversion and X is prefixed to the odd-numbered outputs, that is, $XD_1$, $D_2$, $XD_3$, ... $D_{10}$. The point where the phase of the pulse start signal $D_0$ is changed means the point where the pulse start signal $D_0$ is changed from H (high level) to L (low level) or from L to H.

That is, the pulse start signal $D_0$ inputted to an input terminal 152 of the timing generator circuit 151 propagates through the inverter delay circuits 100 to 109, each of which delays the signal by a period td and inverts the phase of the signal, as indicated by $XD_1$ to $D_{10}$ shown in FIG. 2. The inverter delay circuits 100 to 109 thus output $XD_1$, $D_2$, $XD_3$, ... $D_{10}$. That is, when the signal inputted to the input terminal 152 is a positive-logic signal, the (i−1)-th and i-th inverter delay circuits output $XD_{i-1}$ and $D_i$, respectively, where i represents an even number.

The switching circuit 150 includes P-channel transistors 110, 111, 114, 115, 118, 119, 122, and 123 and N-channel transistors 112, 113, 116, 117, 120, 121, 124, 125, 131, and 132. The impedance device $Z_2$, the P-channel transistors 110, 111, the N-channel transistors 112, 113, and the impedance device $Z_1$ are connected in series between the power supply line 134 and the power supply line 133. The impedance device $Z_4$, the P-channel transistors 114, 115, the N-channel transistors 116, 117, and the impedance device $Z_3$ are connected in series between the power supply line 134 and the power supply line 133. The impedance device $Z_6$, the P-channel transistors 118, 119, the N-channel transistors 120, 121, and the impedance device $Z_5$ are connected in series between the power supply line 134 and the power supply line 133. The impedance device $Z_8$, the P-channel transistors 122, 123, the N-channel transistors 124, 125, and the impedance device $Z_7$ are connected in series between the power supply line 134 and the power supply line 133.

The drain terminals of the P-channel transistors 111, 115, 119, and 123 are connected to an output line 130. The N-channel transistors 131 and 132 are connected in series between the output line 130 and the power supply line 133. The signal $XD_1$ is inputted to the gate terminal of the N-channel transistor 113. The signal $D_2$ is inputted to the gate terminals of the P-channel transistor 111 and the N-channel transistor 112. The signal $XD_3$ is inputted to the gate terminals of the P-channel transistor 110 and the N-channel transistor 117. The signal $D_4$ is inputted to the gate terminals of the P-channel transistor 115 and the N-channel transistor 116. The signal $XD_5$ is inputted to the gate terminals of the P-channel transistor 114 and the N-channel transistor 121. The signal $D_6$ is inputted to the gate terminals of the P-channel transistor 119 and the N-channel transistor 120. The signal $XD_7$ is inputted to the gate terminals of the P-channel transistor 118 and the N-channel transistor 125. The signal $D_8$ is inputted to the gate terminals of the P-channel transistor 123 and the N-channel transistor 124. The signal $XD_9$ is inputted to the gate terminals of the P-channel transistor 122 and the N-channel transistor 132. The signal $D_{10}$ is inputted to the gate terminal of the N-channel transistor 131.

The pulse generator circuit 1 further includes a P-channel transistor 127, the source terminal of which is connected to the power supply line 134 and the gate terminal and the drain terminal of which are connected to the output line 130, and an N-channel transistor 128, the source terminal of which is connected to the power supply line 133 and the gate terminal and the drain terminal of which are connected to the output line 130. The switching circuit 150 operates as follows:

The N-channel transistors 112 and 113 conduct current when $D_2$ and $XD_1$ are H, and connect the output line 130 to the power supply line 133 via the impedance device $Z_1$. The power supply line 133 is connected to a power supply that supplies a voltage V2. That is, when $D_2$ AND $XD_1$ is true, the output line 130 is connected to the voltage V2 via the impedance device $Z_1$.

The P-channel transistors 110 and 111 conduct current when $XD_3$ and $D_2$ are L, and connect the output line 130 to the power supply line 134 via the impedance device $Z_2$. The power supply line 134 is connected to a power supply that supplies a voltage V1. That is, when $D_2$ OR $XD_3$ is false, the output line 130 is connected to the voltage V1 via the impedance device $Z_2$.

The N-channel transistors 116 and 117 conduct current when $D_4$ and $XD_3$ are H, and connect the output line 130 to the power supply line 133 via the impedance device $Z_3$. The P-channel transistors 114 and 115 conduct current when $XD_5$ and $D_4$ are L, and connect the output line 130 to the power supply line 134 via the impedance device $Z_4$.

The N-channel transistors 120 and 121 conduct current when $D_6$ and $XD_5$ are H, and connect the output line 130 to the power supply line 133 via the impedance device $Z_5$. The P-channel transistors 118 and 119 conduct current when $XD_7$ and $D_6$ are L, and connect the output line 130 to the power supply line 134 via the impedance device $Z_6$.

The N-channel transistors 124 and 125 conduct current when $D_8$ and $XD_7$ are H, and connect the output line 130 to the power supply line 133 via the impedance device $Z_7$. The P-channel transistors 122 and 123 conduct current when $XD_9$ and $D_8$ are L, and connect the output line 130 to the power supply line 134 via the impedance device $Z_8$.

The N-channel transistors 131 and 132 conduct current when $D_{10}$ and $XD_9$ are H, and connect the output Line 130 to the power supply line 133 via the impedance device $Z_9$.

Each of the P-channel transistor 127 and the N-channel transistor 128 is a MOS resistor. They divide potentials applied to the power supply lines 134 and 133 and set the potential at the output line 130 when the switching circuit 150 is connected to neither the voltage V1 nor the voltage V2.

In the operation described above, the output line 130 is switched between the voltage V1 and the voltage V2 via the impedance device $Z_i$ whenever td elapses. Let $t_{i-1}$ be a period during which $D_i$ AND $XD_{i-1}$ is true, and $t_i$ be a period during which $D_i$ OR $XD_{i-1}$ is false. The output line 130 is connected to the voltage V2 via the impedance device $Z_{i-1}$ during the period $t_{i-1}$, while connected to the voltage V1 via the impedance device $Z_i$ during the period $t_i$, as indicated by PulseOut in FIG. 2.

Therefore, the impedance devices $Z_i$ and $Z_{i-1}$ limit the output driving capability of the voltages V1 and V2, and adjusting the device values of the impedance devices $Z_i$ and $Z_{i-1}$ allows the envelope of the pulse waveform PulseOut outputted from the output line 130 to be arbitrarily set. The outputted pulse waveform PulseOut depends on the value of a load connected to the output and the driving capability limited by the impedance devices $Z_i$ and $Z_{i-1}$. When the load contains a capacitance component, in particular, the output pulses are integrated and a waveform close to a triangular wave having different wave heights is provided, as shown in FIG. 2.

When the device values of the impedance devices $Z_i$ and $Z_{i-1}$ are determined in accordance with the principle described above to provide an envelope of a band-limited pulse waveform PulseOut, the generated pulse waveform PulseOut contains pulses automatically band-limited. Since the device values of the impedance devices $Z_i$ and $Z_{i-1}$ are arbitrarily determined, the wave heights of the first and last output pulses are not necessarily lowered unlike FIG. 11, but the spectral characteristics can be freely set. Since the inverse Fourier transformation of a given target spectrum is the waveform along the temporal axis, the envelope waveform of the output pulses can be calculated from necessary band characteristics, the calculated envelope waveform can be used to determine the device values of the impedance devices $Z_i$ and $Z_{i-1}$. Desired band characteristics can thus be obtained. Alternatively, when the device values of the impedance devices $Z_i$ and $Z_{i-1}$ are determined by a sampling operation based on a Gaussian function, the spread of the pulses along the temporal axis and the spread of the pulses along the frequency axis, that is, the two band spreads (multiplication of the two band spreads), can be theoretically minimized.

The present embodiment described above can provide the following advantageous effects:

In the present embodiment, a circuit as simple as the circuit of related art can generate pulses that have undergone necessary band limitation. The generated pulses, even when they are high-frequency, high-speed pulses close to the operation limit of the devices in the circuit, can be precise and well characterized.

The impedance devices $Z_1$ to $Z_9$ can be replaced with the channel resistance of the switching circuit 150. That is, when the ratio of the channel length to the channel width of each of the transistors that form the switching circuit 150 is adjusted to be the predetermined device values of the impedance devices $Z_i$ and $Z_{i-1}$, the impedance devices can be included in the ON resistance of the switching transistors, whereby the number of parts can be reduced.

Second Embodiment

A second embodiment of the pulse generator circuit will be described below.

Figure 3:
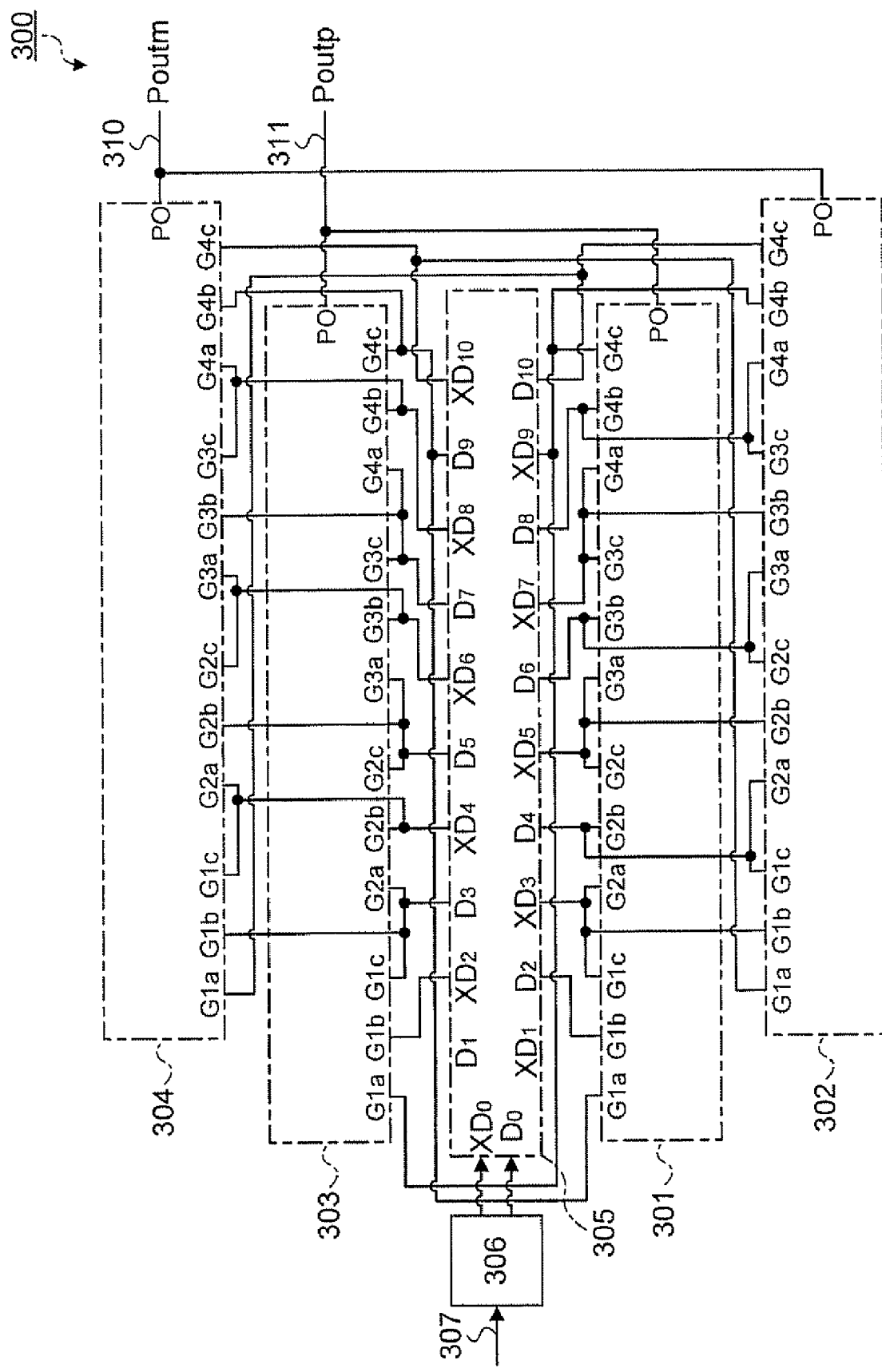
FIG. 3 is a circuit diagram showing the configuration of a pulse generator circuit according to a second embodiment.
Figure 4:
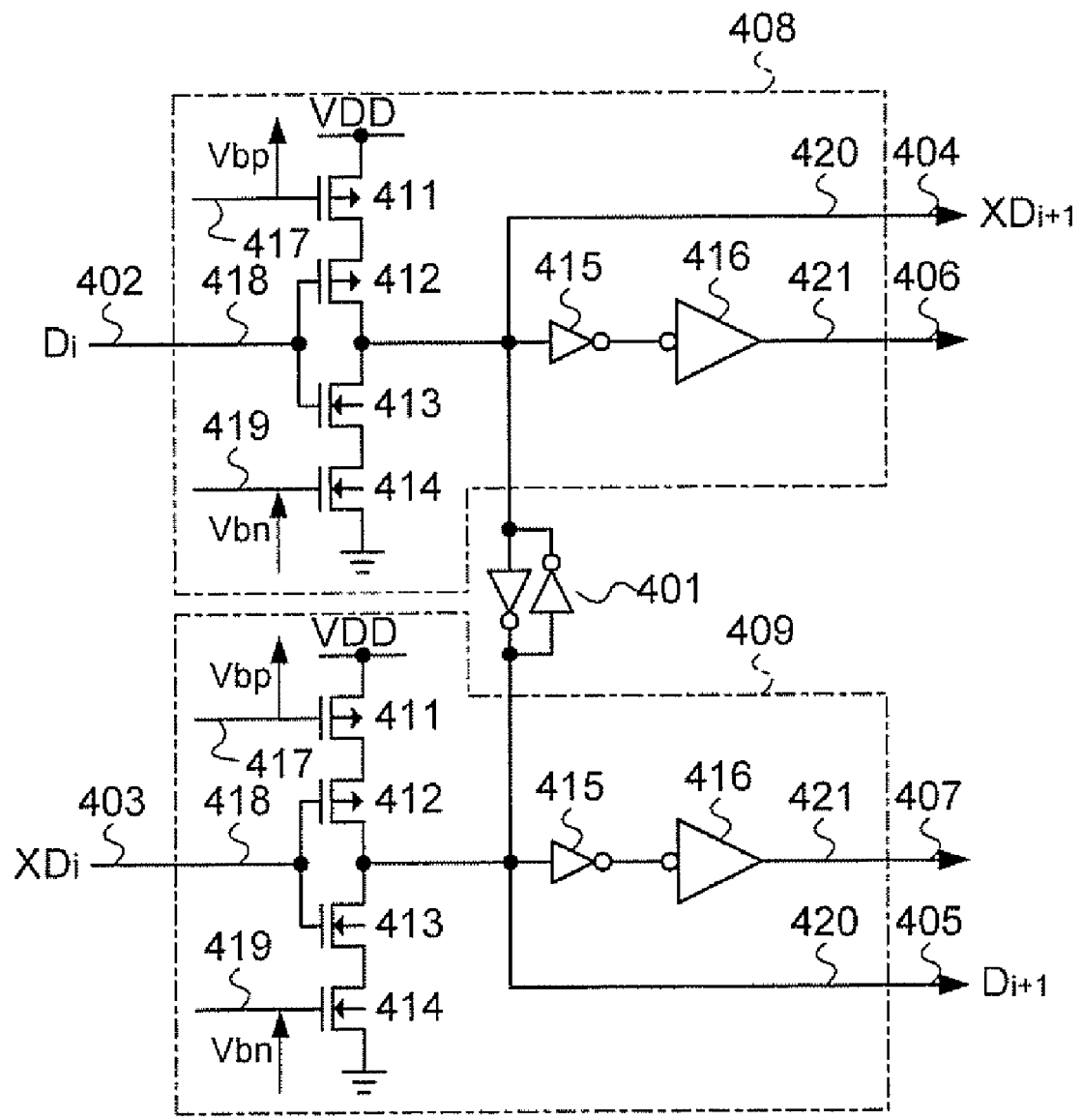
FIG. 4 is a circuit diagram showing the configuration of a differential inverter delay circuit according to the second embodiment.
Figure 5:
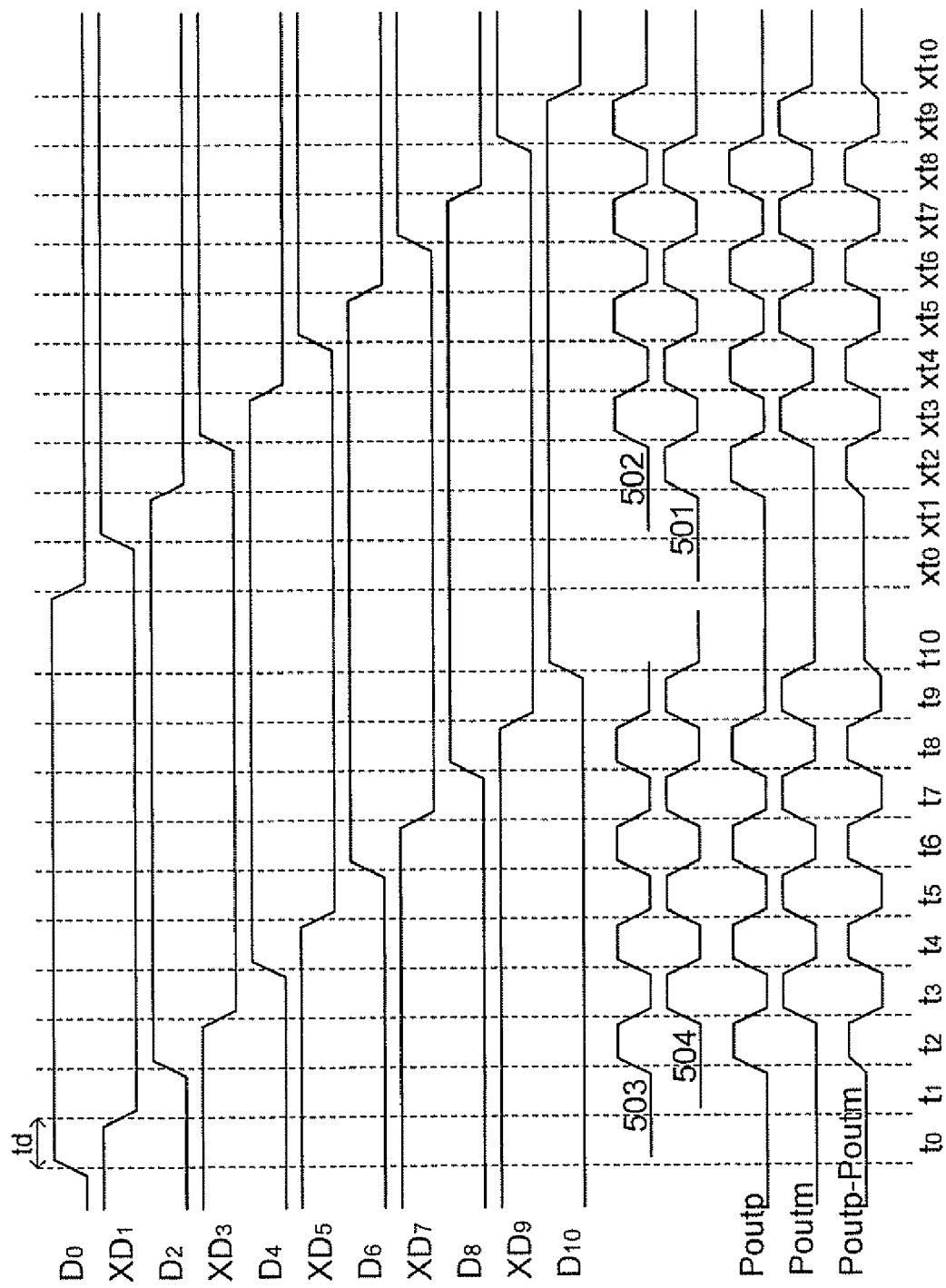
FIG. 5 is a timing chart showing the operation of the pulse generator circuit according to the second embodiment.

In the second embodiment, the configuration of a circuit that band-limits the differential output pulse signals described in FIG. 10G to generate pulses will be described with reference to FIGS. 3 to 5. FIG. 3 is a circuit diagram showing the configuration of a pulse generator circuit that generates differential output pulse signals. FIG. 4 is a circuit diagram showing the configuration of a differential inverter delay circuit. FIG. 5 is a timing chart explaining the operation of the pulse generator circuit that generates differential output pulse signals.

As shown in FIG. 3, a pulse generator circuit 300 is started by a pulse start signal $D_0$ inputted to a terminal 307. A converter circuit 306 receives the pulse start signal $D_0$, converts it into signals $D_0$ and $XD_0$ having phases inverted from each other, and outputs the signals $D_0$ and $XD_0$. A differential inverter delay circuit 305 is started by the signals $D_0$ and $XD_0$.

In the differential inverter delay circuit 305, each delay device can have a circuit configuration shown in FIG. 4. FIG. 4 shows an example of the configuration of each stage of the differential inverter delay circuit 305, each stage having the same inverter delay circuits 408 and 409 arranged side by side and coupled to each other via a cross-couple inverter 401.

The internal structure of the inverter delay circuits 408 and 409 will first be described. Since the inverter delay circuits 408 and 409 have the same configuration, the internal components have the same reference numerals. In each of the inverter delay circuits 408 and 409, a P-channel transistor 412 and an N-channel transistor 413 form an inverter circuit, and a signal inputted to an input terminal 418 is inverted and delayed by a period td, outputted from an output terminal 420, and inputted to the following inverter delay circuit. A small-buffer circuit 415 and a large-buffer circuit 416 are connected in series to the output terminal 420 not to increase the amount of delay generated in the inverter circuit described above. A terminal 421 outputs a signal for driving switching circuits 301 to 304 shown in FIG. 3.

An N-channel transistor 414 is connected between the source of the N-channel transistor 413 and a ground potential, and a P-channel transistor 411 is connected between the source of the P-channel transistor 412 and a power supply potential VDD. Controlling gate-source voltages Vbp and Vbn applied to the P-channel transistor 411 and the N-channel transistor 414 can control the power supply current flowing into the inverter circuit. The gate-source voltages Vbp and Vbn are typically controlled in such a way that the absolute values thereof are the same in order to maintain the symmetry between the rise and fall portions of the output from the inverter circuit. In this way, the operation speed of the inverter circuit and hence the delay period td can be controlled. To generate pulses having the target frequency spectrum, the voltages at terminals 417 and 419 may be controlled so that $P_W$=td is satisfied.

At the input terminals 418 of the i-th inverter delay circuits 408 and 409, a signal $D_i$ is inputted to an input terminal 402 and a signal $XD_i$ is inputted to an input terminal 403. The i-th inverter delay circuits 408 and 409 are therefore driven by the signals having phases inverted from each other. At the output terminals 420 of the i-th inverter delay circuits 408 and 409, a signal $XD_{i+1}$ is outputted from an output terminal 404 and a signal $D_{i+1}$ is outputted from an output terminal 405. The signals $XD_{i+1}$ and $D_{i+1}$ are connected to the following inverter delay circuits 408 and 409. The output terminals 420 are connected to output terminals 406 and 407 via the small-buffer circuit 415 and the large-buffer circuit 416, the output terminals 406 and 407 outputting signals for driving the switching circuits 301 to 304. In the following description, the small-buffer circuit 415 and the large-buffer circuit 416, although they generate delay, will be omitted, and the signals for driving the switching circuits 301 to 304 will have the same names $XD_{i+1}$ and $D_{i+1}$ (In the present embodiment in which only the difference in timing is in question, the delay generated in the small-buffer circuit 415 and the large-buffer circuit 416 can be omitted when the inverter delay circuits have the same characteristics and generate the same amount of delay).

When the bi-phase signals outputted from the converter circuit 306, that is, the signals $D_0$ and $XD_0$ having phases inverted from each other, simultaneously start the differential inverter delay circuit 305, 10 delayed signals $XD_1, D_2, \ldots D_{10}$ shown in FIG. 5 are obtained, any of the delayed signals having the delay td and having the phase inverted with respect to the preceding delayed signal. At the same time, 10 delayed signals $D_1, XD_2, \ldots XD_{10}$ are obtained, which are obtained by inverting the above signals. In FIG. 5, the signals $D_1, XD_2, \ldots XD_{10}$ are omitted.

In FIG. 3, the internal structure of each of the switching circuits 301 302, 303, and 304 is the same as the portion indicated by the dotted line 153 obtained by removing the inverter delay circuits 101 to 109 and other components from the pulse generator circuit 1 shown in FIG. 1. That is, the internal structure includes the switching circuit 150, the components of which being connected to the voltages V1 and V2 via the predetermined impedance devices $Z_1$ to $Z_8$. When gate terminals Gka and Gkb (k is an integer) simultaneously receive H, an output terminal PO is connected to the voltage V2 via the impedance device $Z_{2k-1}$, whereas when gate terminals Gkb and Gkc simultaneously receive L, the output terminal PO is connected to the voltage V1 via the impedance device $Z_{2k}$.

Figures 17, 18:
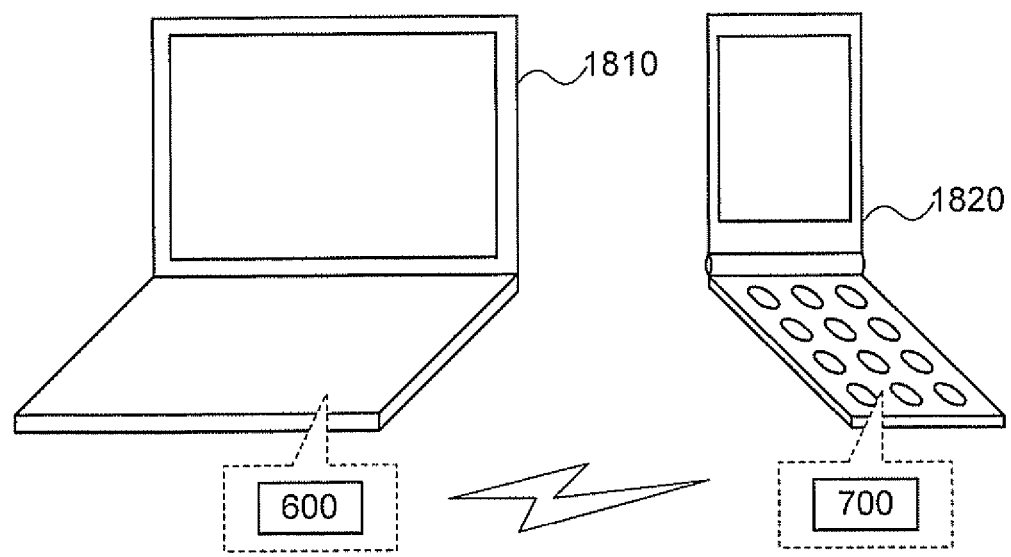
FIG. 17 is a table showing the connection between the terminals of switching circuits and the terminals of a differential inverter delay circuit according to the second embodiment.
FIG. 18 is a schematic view showing the configuration of electronic apparatus according to a first modification.

FIG. 17 is a table showing the connection between the terminals of the switching circuits 301 to 304 and the terminals of the differential inverter delay circuit 305 shown in FIG. 3.

As shown in FIG. 3, when $D_9$ and $D_2$ are H at the same time, that is, $D_9$ AND $D_2$ is true (from $t_9$ to $xt_1$ in FIG. 5), the switching circuit 301 outputs the voltage V2 to the pulse output terminal PO via the impedance device $Z_1$. Further, when $XD_{i-1}$ AND $D_i$ is true (the period $xt_{i-1}$ in FIG. 5) for an even number i in the range $4 \leq i \leq 8$, the voltage V2 is outputted to the pulse output terminal PO via the impedance device $Z_{i-1}$. When $D_i$ and $XD_{i+1}$ are L at the same time, that is, $XD_i$ AND $D_{i+1}$ is true (the period $xt_i$), for an even number i in the range $2 \leq i \leq 8$, the voltage V1 is outputted to the pulse output terminal PO via the impedance device $Z_i$ (indicated by the waveform 501 in FIG. 5). (The wave heights of the fingers are not the same because they are limited by the respective impedance devices, but are drawn to be the same in the figure.)

Similarly, when $XD_{10}$ and $XD_3$ are H at the same time, that is, $XD_{10}$ AND $XD_3$ is true (from $xt_{10}$ to $t_2$ in FIG. 5), the switching circuit 302 outputs the voltage V2 to the pulse output terminal PO via the impedance device $Z_1$. Further, when $XD_i$ AND $D_{i+1}$ is true (the period $t_i$ in FIG. 5) for an even number i in the range $4 \leq i \leq 8$, the voltage V2 is outputted to the pulse output terminal PO via the impedance device $Z_{i-1}$. When $XD_{i+1}$ and $D_{i+2}$ are L at the same time, that is, $D_{i+1}$ AND $XD_{i+2}$ is true (the period $t_{i+1}$), for an even number i in the range $2 \leq i \leq 8$, the voltage V1 is outputted to the pulse output terminal PO via the impedance device $Z_i$ (indicated by the waveform 502 in FIG. 5). (The wave heights of the fingers are not the same because they are limited by the respective impedance devices, but are drawn to be the same in the figure.)

When $XD_9$ and $XD_2$ are H at the same time, that is, $XD_9$ AND $XD_2$ is true (from $xt_9$ to $t_1$ in FIG. 5), the switching circuit 303 outputs the voltage V2 to the pulse output terminal PO via the impedance device $Z_1$. Further, when $D_{i-1}$ AND $XD_i$ is true (the period $t_{i-1}$ in FIG. 5) for an even number i in the range $4 \leq i \leq 8$, the voltage V2 is outputted to the pulse output terminal PO via the impedance device $Z_{i-1}$. When $XD_i$ and $D_{i+1}$ are L at the same time, that is, $D_i$ AND $D_{i+1}$ is true (the period $t_i$), for an even number i in the range $2 \leq i \leq 8$, the voltage V1 is outputted to the pulse output terminal PO via the impedance device $Z_i$ (indicated by the waveform 503 in FIG. 5). (The wave heights of the fingers are not the same because they are limited by the respective impedance devices, but are drawn to be the same in the figure.)

When $D_{10}$ and $D_3$ are H at the same time, that is, $D_{10}$ AND $D_3$ is true (from $t_{10}$ to $xt_2$ in FIG. 5), the switching circuit 304 outputs the voltage V2 to the pulse output terminal PO via the impedance device $Z_1$. Further when $XD_i$ AND $D_{i+1}$ is true (the period $xt_i$ in FIG. 5) for an even number i in the range $4 \leq i \leq 8$, the voltage V2 is outputted to the pulse output terminal PO via the impedance device $Z_{i-1}$. When $D_{i+1}$ and $XD_{i+2}$ are L at the same time, that is, $XD_{i+1}$ AND $D_{i+2}$ is true (the period $xt_{i+1}$), for an even number i in the range $2 \leq i \leq 8$, the voltage V1 is outputted to the pulse output terminal PO via the impedance device $Z_i$ (indicated by the waveform 504 in FIG. 5). (The wave heights of the fingers are not the same because they are limited by the respective impedance devices, but are drawn to be the same in the figure.)

Further, the output terminal PO of the switching circuit 301 is connected to the output terminal PO of the switching circuit 303 in the wired-OR configuration to produce an output signal Poutp, which is one of the differential outputs, from a pulse output terminal 311, and the output terminal PO of the switching circuit 302 is connected to the output terminal PO of the switching circuit 304 in the wired-OR configuration to produce an output signal Poutm, which is the other one of the differential outputs, from a pulse output terminal 310.

The connection described above allows output pulses to be band-limited by setting the impedance devices $Z_1$ to $Z_8$ connected in each of the switching circuits 301, 302, 303, and 304 to a predetermined value. Specifically, the impedance value is set to a large value to lower the wave heights of the first and last fingers of the output pulses.

Thus setting the values of the impedance devices allows the envelope of the generated pulses to be freely set, whereby the generated pulses can be band-limited.

While the values of the impedance devices connected in each of the switching circuits 301, 302, 303, and 304 are a common value in the above description, the impedance set for a switching circuit may differ from those set for the other switching circuits. In this case, the degree of freedom in the setting becomes larger for detailed setting.

Further, using the channel resistance of the switching transistors allows the switching devices to also serve as the impedance devices, whereby the number of necessary devices can be reduced.

When the connection described above is employed, the switching circuit 301, which generates the pulse train in response to the fall portion of $D_0$ (from the period $xt_2$ to the period $xt_8$), and the switching circuit 303, which generates the pulse train in response to the fall portion of $XD_0$ (from the period $t_2$ to the period $t_8$), are completely symmetric with respect to each other in terms of circuitry. Similarly, the switching circuit 304, which generates the pulse train in response to the fall portion of $D_0$ (from the period $xt_3$ to the period $xt_9$), and the switching circuit 302, which generates the pulse train in response to the fall portion of $XD_0$ (from the period $t_3$ to the period $t_9$), are completely symmetric with respect to each other in terms of circuitry. That is, in FIG. 3, any of the inverter delay circuits with its terminal names $XD_i$ and $D_i$ interchanged (i is an integer in the range $0 \leq i \leq 10$) is identical to the original circuit. The switching circuits 301 and 303 or the switching circuits 302 and 304 therefore produce completely the same pulse waveform in response to the rise or fall portion of $D_0/XD_0$. The generated pulses have practically the same symmetric waveform when at least the circuits are formed on the same semiconductor substrate in a symmetric pattern arrangement. Further, the connection for the switching circuit 302 or 304 coincides with the connection for the switching circuit 301 or 303 when the terminal names of the connected inverter delay circuits are changed from $D_i$ to $XD_{i-1}$ or from $XD_i$ to $D_{i-1}$. In this case, the circuit configuration of the switching circuit 302 or 304 is practically the same as that of the switching circuit 301 or 303. The waveform of the pulses generated by the switching circuit 302 or 304 is practically the same as and symmetric with the waveform of the pulses generated by the switching circuit 301 or 303, although the time at which the pulses generated by the switching circuit 302 or 304 is shifted by td from the time at which the pulses generated by the switching circuit 301 or 303.

Connecting the output terminal PO of the switching circuit 301 to the output terminal PO of the switching circuit 303 in the wired-OR configuration to form the pulse output terminal Poutp 311, which is one of the differential outputs, and connecting the output terminal PO of the switching circuit 302 to the output terminal PO of the switching circuit 304 in the wired-OR configuration to form the pulse output terminal Poutm 310, which is the other one of the differential outputs, allow the difference Poutp-Poutm to be symmetric pulses, as shown in FIG. 5. In FIG. 5, the pulse output waveform is not obtained in consideration of load capacitance. It is, however, self-evident that the symmetry of the pulse output waveform will not deteriorate even when a large capacitance load is connected.

In the present embodiment, the transistors 127 and 128, which determine an intermediate level in the first embodiment, are not necessary, and it is therefore possible to eliminate leak current produced in this portion and hence reduce the power consumption in the circuit. Further, the present embodiment includes no switching device that is desirably driven at a delay that is half the delay td, such as the transistors 131 and 132, whereby the circuit design becomes easier. Moreover, while 10 inverter delay devices are required in the first embodiment, 9 inverter delay devices will be enough in the present embodiment, whereby the number of devices used can be slightly reduced (Note that the outputs $D_1$ and $XD_1$ from the first inverter delay device are not used. The first inverter delay device can be omitted).

While the inverter delay devices are numbered from one in the above description, the outputs from the inverter delay devices may be numbered from an arbitrary number because what important is the order and logic of the switching operation and the setting values of $Z_{i-3}$ and $Z_{i-2}$. In this case, i is an even number in a predetermined range determined accordingly. In the switching control, all the outputs from the inverter delay devices may not be used, and predetermined logic in accordance of which the control is performed before a pulse may differ from predetermined logic in accordance of which the control is performed after the pulse.

Further, Boolean algebra theorem can be used to differently express the above description based on positive and negative logic. The above expression is, however, equivalent to the above description, and the equivalent circuitry should of course be encompassed in the present embodiment.

As described above, the present embodiment allows pulse generation whenever inversion occurs in any of the inverter delay circuits in response to the inversion of the start signal. According to the present embodiment, pulses are generated whenever inversion occurs in any of the inverter delay circuits, which consumes the major part of the power consumed in the pulse generator circuit, whereby the power consumption per generated pulse can be minimized. Further, the generated pulses, even when they are high-frequency, high-speed pulses close to the operation limit of the circuit devices, can be symmetric, precise, band-limited, differential pulses.

Third Embodiment

A third embodiment of the pulse generator circuit will be described below.

FIGS. 6 to 9 explain key portions of a communication apparatus using the pulse generator circuit 1 of the first embodiment or the pulse generator circuit 300 of the second embodiment, and show cases where the pulse generator circuit 1 or the pulse generator circuit 300 is applied to a UWB transmitter and a UWB receiver.

Figure 6:
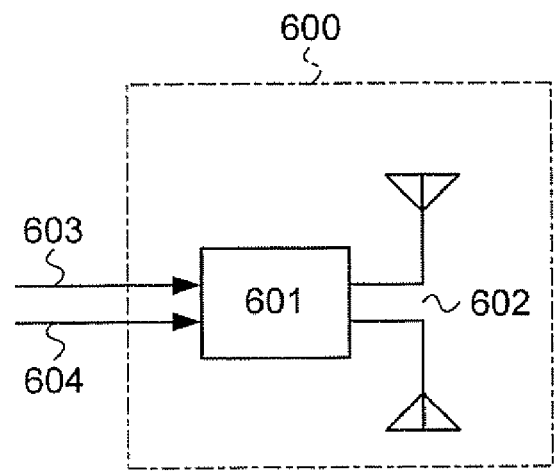
FIG. 6 shows an example of a UWB communication apparatus according to an embodiment of the invention.

FIG. 6 is a block diagram schematically showing a UWB-IR transmitter 600. A pulse generator circuit 601 is comprised of the pulse generator circuit 1 (FIG. 1) or the pulse generator circuit 300 (FIG. 3), and generates pulses that form a UWB signal to be transmitted. An input terminal 603 is a terminal to which a start signal is inputted, and an input terminal 604 is a terminal to which data to be transmitted are inputted. The generated pulses are modulated in accordance with the signal inputted to the input terminal 604, and the modulation method will be described later.

The pulse generator circuit 300 of the second embodiment has two output terminals and supplies differential pulse signals. The UWB-IR transmitter 600 using the pulse generator circuit 300 can therefore drive a balanced antenna. FIG. 6 shows a case where a balanced antenna 602 is driven in the UWB-IR transmitter 600. Alternatively, the pulse generator circuit 1 of the first embodiment can be used to generate single-ended output pulses so as to drive an unbalanced antenna, such as a monopole antenna.

Examples of the modulation method include pulse bi-phase modulation (BPM) in which modulation is carried out by switching the polarity of output pulses in accordance with the value of transmission data inputted to the input terminal 604, and pulse position modulation (PPM) in which a start signal is connected to a delay circuit and the delay period of the start signal is switched in accordance with transmission data.

Figure 8:
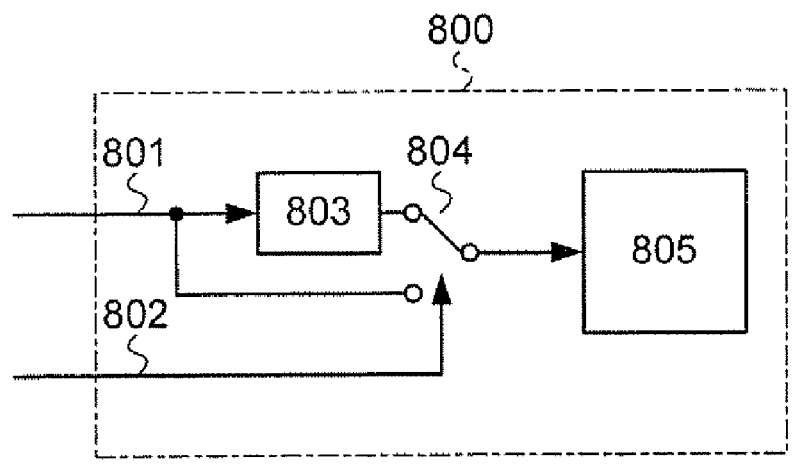
FIG. 8 shows an example of a UWB communication apparatus according to an embodiment of the invention.

FIG. 8 shows a PPM modulator circuit 800. An input terminal 801 is a terminal to which the start signal is inputted. A signal delayed from the start signal by using a delay circuit 803 and a non-delayed signal that has not passed through the delay circuit 803, the original signal, are generated. A switch 804 chooses either of the two signals, and the chosen signal is inputted to a pulse generator circuit 805. Choosing the signal that has passed through the delay circuit 803 or the signal that has not passed therethrough based on the bit value (1 or 0) of transmission data inputted to an input terminal 802 allows the start signal delay period generated in the delay circuit to shift in accordance with the value of the transmission data for PPM modulation.

Figure 9:
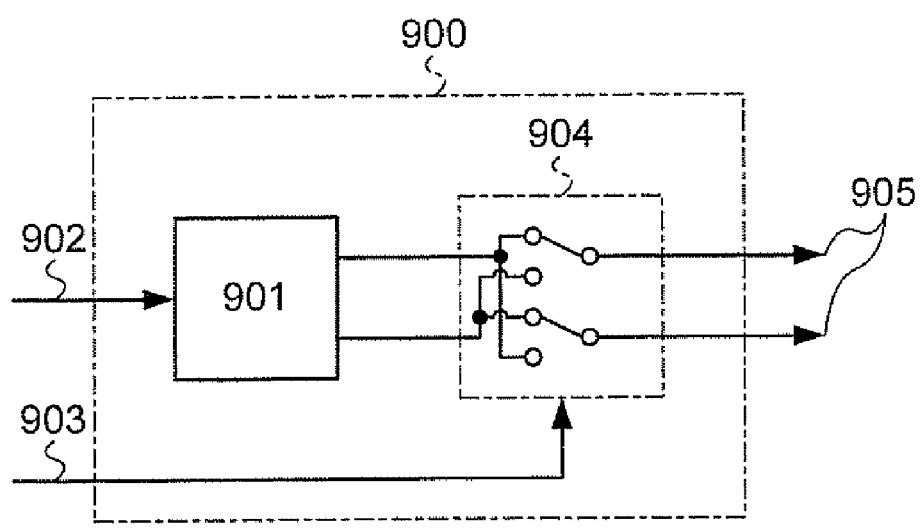
FIG. 9 shows an example of a UWB communication apparatus according to an embodiment of the invention.

FIG. 9 shows a BPM modulator circuit 900 using BPM as the modulation method. A start signal inputted to an input terminal 902 is inputted to a start terminal of a pulse generator circuit 901. The pulse generator circuit 901 can be the pulse generator circuit 300 of the second embodiment described above. The polarity of the pulses generated by the pulse generator circuit 901 is inverted based on transmission data applied to an input terminal 903 by switching a two-pole, double-throw switch 904. The operation described above allows BPM-modulated, balanced pulses to be supplied from the output terminals 905.

The pulse generator circuit 901 can alternatively be the single-ended pulse generator circuit 1 of the first embodiment. In this case, the single-ended output is connected to one input of the two-pole, double-throw switch 904, which inverts the polarity of the pulses from the pulse generator circuit 1 based on transmission data applied to the input terminal 903, and the other input of the switch 904 is connected to a ground potential.

Like the present embodiment, using the pulse generator circuit 1 or the pulse generator circuit 300 as the pulse generator circuit in an UWB-IR transmitter can reduce adverse effects on other portions without using a special filter or other components because the generated pulses have a small spectral spread and a low-level side lobe.

Figure 7:
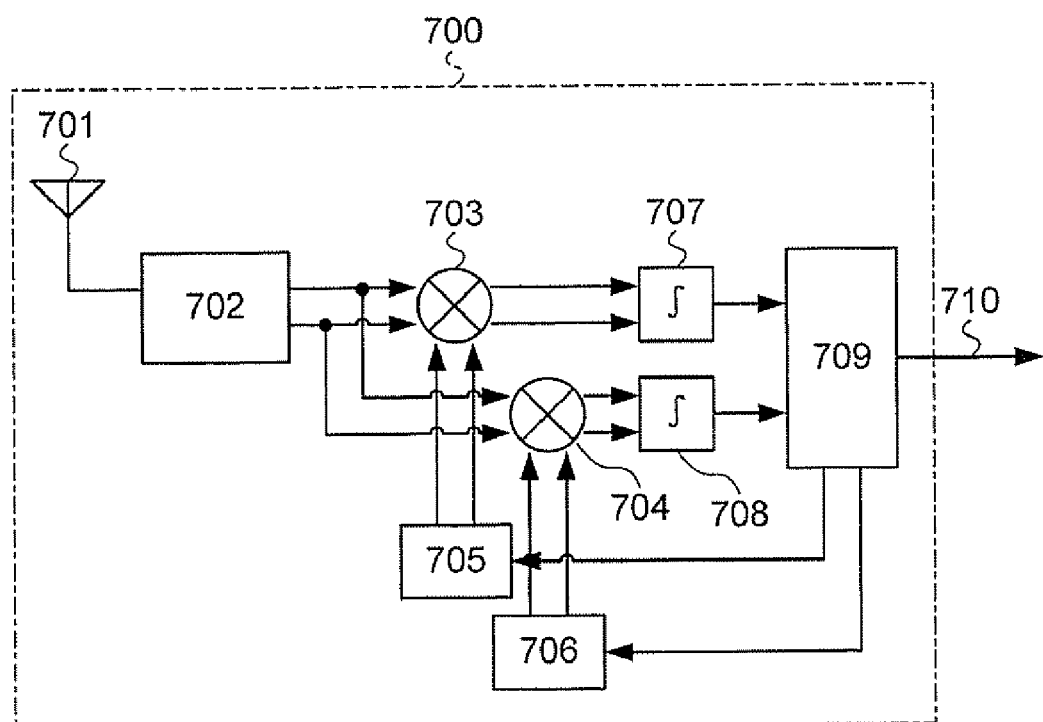
FIG. 7 shows an example of a UWB communication apparatus according to an embodiment of the invention.

FIG. 7 is a block diagram showing a UWB receiver 700 using the pulse generator circuit 1 of the first embodiment or the pulse generator circuit 300 of the second embodiment. A UWB pulse signal received by a receiver antenna 701 is amplified by a low-noise amplifier circuit 702 and inputted to I/Q mixer circuits 703 and 704. The mixer circuits 703 and 704 multiply the amplified UWB pulse signal by template pulses generated by template pulse generator circuits 705 and 706, and send the resultant signals to integrator circuits 707 and 708. The integrator circuits 707 and 708 remove high-frequency components in the signals that have undergone the mixing (multiplication) in the integrator circuits 707 and 708 and calculate correlation values. A discriminator circuit 709 examines the intensities of the signals to judge the transmitted bits, returns them to the original transmission data, and outputs the transmission data from an output terminal 710.

Each of the template pulse generator circuits 705 and 706 can be the pulse generator circuit 1 of the first embodiment or the pulse generator circuit 300 of the second embodiment. The pulse generator circuit 300 of the second embodiment, in particular, can generate differential template pulses and allows the low-noise amplifier circuit 702 and the mixer circuits 703 and 704 to be differential circuits. A differential circuit is suitable for in-phase noise cancellation and low-power operation, and hence convenient for a low-power, low-noise system configuration. Further, use of IQ template pulses having phases different from each other by 90 degrees allows efficient reception even in BPM or PPM. That is, in BPM or PPM, it is possible, for example, to use the I phase for data demodulation and the Q phase for tracking. Specifically, adjusting the template generation timing in such a way that the Q-phase output is always zero allows the I-phase output amplitude to be maximized, whereby such control allows synchronous detection tracking. As shown in FIG. 7, using start signals having phases different from each other by 90 degrees to start the two template pulse generator circuits 705 and 706 allows generation of IQ template pulses.

Each of the template pulse generator circuits can alternatively be the pulse generator circuit 1 of the first embodiment. When the pulse generator circuit 1 is used, each of the low-noise amplifier circuit 702 and the mixer circuits 703 and 704 is an unbalanced circuit. When IQ bi-phase templates are necessary, two pulse generator circuits 1 may be used in such a way that one is started at a certain time and the other is started after a predetermined period elapses from the certain time.

One may consider that the template pulses generated by the template pulse generator circuits 705 and 706 in the UWB receiver 700 are not necessarily band-limited because no energy radiation into space is intended. However, since the template pulses most highly correlate with the pulses used in a UWB-IR transmitter when their waveforms are the same, the template pulse generator circuits 705 and 706 in the UWB receiver 700 should ideally be the same as the pulse generator circuit used in the UWB-IR transmitter. It is needless to say that the configuration described above is significantly effective in reducing spurious radiation, which is a problem in many receivers.

The present pulse generator circuit can generate a well-balanced, less-distorted signal with less signal-to-signal variation in amplitude or other factors by using simple circuitry. The present pulse generator circuit also consumes less power. The present pulse generator circuit therefore has all specifications necessary to increase the performance of a UWB communication apparatus, such as differential signal generation, IQ signal generation, and low distortion. Using the present pulse generator circuit in a UWB communication apparatus therefore allows a high-performance apparatus to be achieved.

When a CMOS integrated circuit is used to achieve the present pulse generator circuit, power is consumed only during the transition period in pulse generation, whereby there is not what is called idling current. When the pulse generator circuit described above is used in a communication apparatus, the communication apparatus can always operate at minimum power consumption according to the amount of information to be transmitted (bit rate).

While some embodiments of the pulse generator circuit have been described, the pulse generator circuit is not at all limited thereto, but can be implemented in a variety of forms to the extent that they do not depart from the spirit of the invention.

First Modification

An example of an electronic apparatus using a pulse generator circuit will be described. FIG. 18 is a schematic view showing the configuration of a notebook PC (Personal Computer) 1810 and a mobile phone 1820 as electronic apparatus according to a first modification. The notebook PC 1810 has the UWB-IR transmitter 600 described in the third embodiment built therein, and mobile phone 1820 has the UWB receiver 700 described in the third embodiment built therein. The notebook PC 1810 can transmit information data from the UWB-IR transmitter 600, and the mobile phone 1820 can receive the information data by the UWB receiver 700.

The entire disclosure of Japanese Patent Applications Nos: 2008-051704, filed Mar. 3, 2008 and filed Jan. 5, 2009 are expressly incorporated by reference herein.

What is claimed is:

1. A pulse generator circuit that outputs pulses having a predetermined shape from an output terminal based on a start signal, the pulse generator circuit comprising:
    a timing generator circuit that generates (n+1) signals (n is an integer greater than or equal to 2), the phases of which sequentially change at predetermined time intervals from the point when the phase of the start signal changes;
    first and second power supplies that supply predetermined potentials;
    n impedance devices, having device values that are determined based on sampled values of the envelope of the pulses to be outputted; and
    a switching circuit that alternately connects the output terminal to the first or second power supply in a predetermined order according to the value of a logic function based on the (n+1) signals via the corresponding impedance device.

2. The pulse generator circuit according to claim 1, wherein the impedance devices and the switching circuit are comprised of switching devices, each of which having an impedance when the switching device conducts current in a predetermined manner.

3. The pulse generator circuit according to claim 1, wherein the timing generator circuit includes delay circuits connected in tandem, each of the delay circuits generating a predetermined amount of delay.

4. A communication apparatus comprising the pulse generator circuit according to claim 1.

* * * * *